(12) United States Patent
Mohai et al.

(10) Patent No.: US 9,406,755 B2
(45) Date of Patent: Aug. 2, 2016

(54) SMART SEMICONDUCTOR SWITCH

(71) Applicant: Infineon Technologies AG, Neubiberg (DE)

(72) Inventors: Dorin Ioan Mohai, Bucharest (RO); Adrian Finney, Villach (AT); Adrian Apostol, Bucharest (RO); Andrei V. Danchiv, Bucharest (RO); Andrei Cobzaru, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 14/447,246

(22) Filed: Jul. 30, 2014

(65) Prior Publication Data
US 2016/0035835 A1 Feb. 4, 2016

(51) Int. Cl.
  *H01L 27/146* (2006.01)
  *H01L 29/10* (2006.01)
  *H01L 29/06* (2006.01)
  *H01L 29/739* (2006.01)

(52) U.S. Cl.
  CPC ........ *H01L 29/1095* (2013.01); *H01L 29/0603* (2013.01); *H01L 29/7395* (2013.01)

(58) Field of Classification Search
  CPC .................................................. H01L 29/1095
  USPC .......................................... 257/443; 326/101
  See application file for complete search history.

(56) References Cited

U.S. PATENT DOCUMENTS

| | | | |
|---|---|---|---|
| 6,800,925 B2 | 10/2004 | Rossmeier et al. | |
| 2013/0027114 A1* | 1/2013 | Petruzzi | H03K 17/0822 327/437 |

OTHER PUBLICATIONS

"CMOS Schmitt Trigger—A Uniquely Versatile Design Component," Fairchild Semiconductor Corporation, Application Note 140, Jun. 1975, 8 pp.
Office Action from U.S. Appl. No. 14/447,174, dated Dec. 4, 2015, 10 pp.
Response to Office Action mailed Dec. 4, 2015, from U.S. Appl. No. 14/447,174, filed Mar. 1, 2016, 8 pp.

* cited by examiner

*Primary Examiner* — Jamie C Niesz
(74) *Attorney, Agent, or Firm* — Shumaker & Sieffert, P.A.

(57) ABSTRACT

A semiconductor device comprises semiconductor substrate including vertical transistor and with dopants of a first type. Each transistor cell of transistor has body region formed in substrate and with dopants of second type. The body regions form first pn-junctions with substrate. A first well region is formed in substrate and with dopants of a second type forming a second pn-junction with substrate. Switch connects this first well region to body regions. A second well region is formed in the substrate and with dopants of a second type to form third pn-junction with substrate. Detection circuit is integrated in the second well region and to detect whether the first pn-junctions are reverse biased. The switch connects or disconnects the first well region(s) and the body regions of the transistor cell, and is opened, when the first pn-junctions are reverse biased, and closed, when the first pn-junctions are not reverse biased.

12 Claims, 3 Drawing Sheets

US 9,406,755 B2

SMART SEMICONDUCTOR SWITCH

TECHNICAL FIELD

The present disclosure relates to the field of integrated electronic circuit devices, particular an integrated electronic circuit device including a MOS transistor and additional circuitry integrated in one semiconductor die.

BACKGROUND

Many power semiconductor switches can be combined with additional low power analog and digital circuitry in one single semiconductor chip. The additional circuitry may additionally include, inter alia, driver circuits for generating driver signals to activate and deactivate the power semiconductor switches, sensor and measurement circuits for processing measured signals such as chip temperature, output current, and circuitry used for communicating with other devices such as microcontrollers or the like. The power semiconductor switches are often implemented as vertical transistors such as vertical MOSFETs or IGBTs. Vertical transistors usually have the power electrodes (e.g. drain and source electrodes in case of a MOSFET or collector and emitter electrodes in case of an IGBT) on opposing sides (top and bottom) of the semiconductor chip.

In such intelligent semiconductor switches with vertical power transistors, the substrate is usually electrically connected to one load current terminal (e.g., drain terminal, collector terminal) of the power semiconductor switch. If, for example, the power semiconductor switch is a vertical MOS transistor, the drain electrode of the MOS transistor is electrically connected to the semiconductor substrate and thus the drain potential of the transistor also defines the electric potential of the substrate. The mentioned additional analog and digital circuitry is also integrated in the semiconductor substrate, wherein the circuit components are isolated from the surrounding substrate by a pn-junction isolation. For example, the substrate may be n-doped and the mentioned additional circuitry may be implemented within a p-doped well (p-well) formed within the n-doped substrate (n-substrate). The resulting pn-junction between the n-substrate and the p-well is reverse biased during the operation of the integrated circuit and thus the pn-junction electrically isolates the circuit components in the p-well from the surrounding n-substrate.

SUMMARY

A semiconductor device is disclosed herein. In accordance with a first example, the device comprises a semiconductor substrate doped with dopants of a first type. A vertical transistor, which is composed of one or more transistor cells, is formed in the substrate, and each transistor cell has a body region that is formed in the substrate and doped with dopants of a second type. The body regions form first pn-junctions with the surrounding substrate. At least a first well region is formed in the substrate and doped with dopants of a second type to form a second pn-junction with the substrate. This first well region is electrically connected to the body regions of the vertical transistor via a semiconductor switch. A second well region is formed in the substrate and doped with dopants of a second type to form a third pn-junction with the substrate, and a detection circuit is at least partially integrated in the second well region and configured to detect whether the first pn-junctions are reverse biased. The semiconductor switch is configured to electrically connect or disconnect the first well region(s) and the body regions of the transistor cells, wherein the switch is driven to be opened, when the first pn-junctions are reverse biased, and to be closed, when the first pn-junctions are not reverse biased.

BRIEF DESCRIPTION OF THE DRAWINGS

The techniques can be better understood with reference to the following drawings and descriptions. The components in the figures are not necessarily to scale; instead emphasis is placed upon illustrating the principles of the techniques. More-over, in the figures, like reference numerals designate corresponding parts. In the drawings.

DETAILED DESCRIPTION

Figure 1:
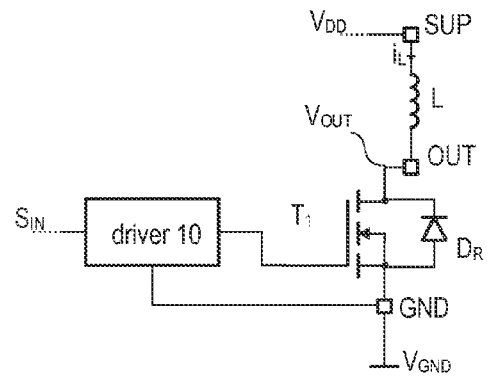
FIG. 1 illustrates the basic configuration of a power MOS transistor as a low-side switch for switching an inductive load.

FIG. 1 illustrates the basic application of a low-side semiconductor switch configured to switch an inductive load L. In the present example, a power MOSFET $T_1$ is used as semiconductor switch. The MOSFET $T_1$ is integrated in a semiconductor chip together with further analog and digital circuitry such as a gate driver circuit 10. The gate driver circuit 10 receives a logic signal $S_{IN}$ and is configured to generate a corresponding driver signal for switching the semiconductor switch on and off. In the present example, the driver circuit 10 is connected to the gate of the MOSFET $T_1$ and generates, as driver signal, an appropriate gate voltage or gate current to activate and deactivate the MOS channel of the MOSFET $T_1$. When using low side switches, the MOSFET $T_1$ is connected between a first supply node and an output node. The first supply node is usually a ground terminal GND supplied with ground potential $V_{GND}$. The output node is usually connected to a respective external output terminal OUT of the semiconductor chip. The load L is connected between the output terminal OUT and a second supply terminal SUP which is supplied with a supply voltage $V_{DD}$. The supply voltage $V_{DD}$ may also be used to supply the further circuitry integrated in the chip such as the gate driver 10. However, a different voltage supply may be used for this purpose.

When the MOSFET $T_1$ is active the voltage $V_{OUT}$ at the output terminal OUT approximately equals the ground potential $V_{GND}$, and the voltage drop across the load L approximately equals $V_{DD}$. The intrinsic reverse diode $D_R$ of the MOSFET $T_1$ is reverse biased and blocking in normal operation. In some situations, however, the output voltage $V_{OUT}$ may be forced to negative values (with respect to ground potential $V_{GND}$) and thus the reverse diode $D_R$ may become—at least temporarily—forward biased and conductive. Such situations may be, inter alia, disturbances at the supply terminal due to electrostatic discharges (ESD), loss of supply voltage ($V_{DD}$) in combination with an inductive load, etc. While a forward biasing of the reverse diode is not necessarily problematic for the MOSFET $T_1$ itself, it may adversely affect the operation of the further (low power) circuitry integrated in the semiconductor chip. These adverse effects are a result of the specific design of "intelligent power switches" which include vertical power MOSFETs and further (analog and digital) circuitry in one single semiconductor chip.

Figure 2:
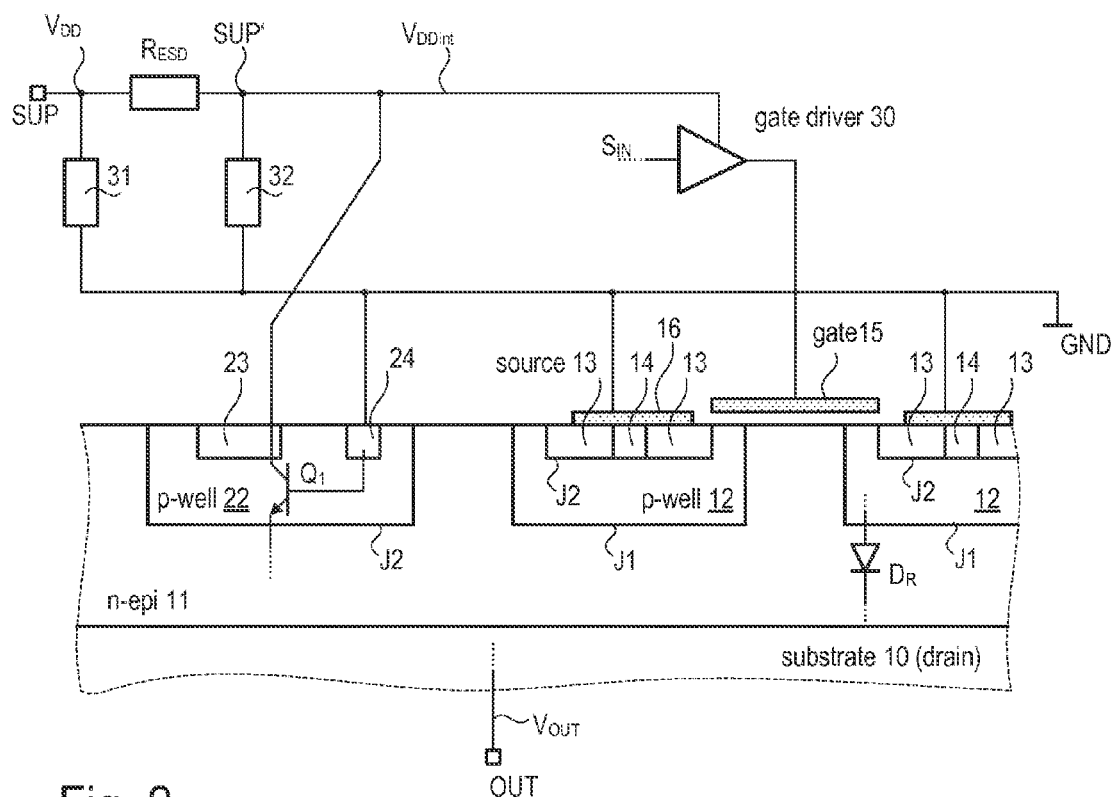
FIG. 2 illustrates one example implementation of the power MOS transistor and additional low power circuitry in one semiconductor chip.

FIG. 2 is a cross sectional view of a semiconductor chip and schematically illustrates one example implementation of an intelligent power switch including a vertical power MOSFET as well as further analog and/or digital circuitry. Such further circuitry may include, inter alia, gate driver circuits for generating gate signals for the MOSFETs, communication circuits for communicating with external controllers, measurement circuits for measuring and processing signals representing physical parameters (e.g. temperature, load current) to be measured, etc. A semiconductor device (e.g. intelligent power switch) includes a semiconductor (silicon) substrate 10 which may include an epitaxial layer 11 of monocrystalline silicon disposed thereon. Substrate 10 and epitaxial layer 11 are doped with dopants of a first type. In the present example n-type dopants (e.g. phosphor, arsenic, etc) are used. Substrate 10 and epitaxial layer 11 together are referred to as semiconductor body 1 or simply as chip. Several doped well regions 12, 22 are formed in the semiconductor body. The well regions adjoin the top surface of the semiconductor body and extend into the semiconductor body 1 in a vertical direction. The well regions are doped with dopants of a second type. In the present example, p-type dopants (e.g. boron, aluminum, etc.) are used. The p-doped well regions are also referred to as p-wells, which may be formed, for example, by way of diffusion or ion implantation.

A plurality of p-wells 12 form body regions of the (n-channel) MOSFET $T_1$, which is composed of a plurality of transistor cells. The p-wells 12 and the n-doped semiconductor body form first pn-junctions J1, which can be regarded as intrinsic reverse diode $D_R$ (see FIG. 1) of the MOSFET $T_1$. It should be noted, that FIG. 2 illustrates a cross section, wherein the p-wells 12 (body regions) appear separated in the depicted cross-sectional plane. However, the p-wells may be coherently linked together in another cross-sectional plane so that one coherent body-region is formed. Analogously, the drain regions of the individual transistor cells may be one coherent drain region formed by the substrate 10. However, vertical transistors composed of a plurality of (coherent or non-coherent) transistor cells, are as such known and thus not further discussed here.

At least one source region 13 is embedded in at least one of the p-wells 12. The source regions 13 are doped with dopants of the first type. In the present example, the source regions 13 are n-doped to form an n-channel MOSFET. As mentioned above with regard to the p-wells 12, the source regions 13 appear separated in the depicted cross section, but may be coherently linked together in another cross-sectional plane, so as to effectively form one coherent source region. This is, however, not necessarily the case. A body contact region 14 may also be embedded in each p-well 12. The body contact regions 14 are doped with dopants of the same type as the p-well, but usually a higher concentration of dopants is applied to allow an ohmic contact between the p-well 12 and a source electrode 16 disposed on the top surface of the semiconductor body. The source regions 13 and the surrounding p-well 13 form second pn-junctions J2 which are, however, usually short-circuited by the source electrode 16 disposed on the top surface of the semiconductor body and directly connecting source regions 13 and body contact regions 14 with only negligible ohmic resistance. The epitaxial layer 11 forms the (n-doped) drift region of the MOSFET $T_1$, whereas the substrate 10 forms the drain region of the MOSFET $T_1$. Usually, the dopant concentration in the drift region is much lower than in the drain region (substrate 10). The source regions of each transistor cells may be all connected to an external source terminal of the MOSFET $T_1$. In the present example, the common source terminal is the ground terminal GND. The drain region, i.e. the substrate 10, is connected to the output terminal OUT (see also FIG. 1).

Gate electrodes 15 may be arranged on the top surface of the semiconductor body 1. The gate electrodes 15 are, however, isolated from the surrounding semiconductor material. Usually silicon oxide is used as isolating material. The gate electrodes 15 are disposed adjacent to that part of the body regions 12, which separate source regions 13 from the drift regions (formed in the epitaxial layer 11). When the gate electrode 15 is charged, a conductive channel is generated in the body region 12 alongside the gate electrode 15. In the present example, the gate electrodes 15 are formed on the top surface of the semiconductor body and the channel current flows substantially parallel to the top surface before being drained, in a vertical direction, to the drain electrode. Alternatively, the gate electrodes may also be arranged in trenches. However, trench transistors are known as such and therefore not further discussed herein. In the present example, only one transistor cell is illustrated. However, a power MOSFET may be composed of a plurality (up to several thousands) of (coherent or non-coherent) transistor cells connected in parallel.

As mentioned above, a further p-well 22 is formed in the semiconductor body 1. As the p-wells 12, which form the body regions of the transistor cells, the p-well 22 adjoins the top surface of the semiconductor body 1 and extends into the semiconductor body in a vertical direction. The p-well 22 encloses further circuitry, e.g. analog and digital circuits, which are isolated using the pn-junction isolation formed by the pn-junction J2 between the p-well 22 and the surrounding n-doped semiconductor body 1. Similar to the body regions 12, the p-well 22 may be formed using diffusion or ion implantation of dopants. Amongst other circuit components, at least a heavily p-doped well contact region 24 and an n-doped supply contact region 23 are embedded in the p-well 22. To ensure that the pn-junction J2 is reverse biased during normal operation and thus operates as pn-junction isolation, the well contact region 24 is electrically connected to the further p-wells 12 (body regions) and thus to the source electrode of the MOSFET $T_1$, whereas the substrate 10 is connected with the drain electrode. As, during normal operation, the drain potential is higher than the source potential of the MOSFET $T_1$, the pn-junction J2 is normally reverse biased and isolates the circuitry embedded in the p-well 22 from the surrounding n-doped semiconductor body 1. The supply contact region 23 is connected to a supply node $SUP_{INT}$ providing a supply voltage, in the present example the internal supply voltage $V_{DDint}$. The well contact region 24 is electrically connected to the ground terminal GND and thus is supplied with ground potential $V_{GND}$.

The example of FIG. 2 also illustrates an ESD protection structure, which includes a resistor $R_{ESD}$ and a first ESD protection circuit 31 and a second ESD protection circuit 32. The resistor $R_{ESD}$ is connected between the supply terminal SUP and the internal supply node $SUP_{INT}$; the first ESD circuit 31 is connected between the supply terminal SUP and ground, whereas the second ESD circuit 32 is connected between the internal supply node SUP' and ground. A gate driver 30 is also symbolized in FIG. 4. The gate driver generates a gate signal supplied to the gate electrodes 15 in accordance with an input signal $S_{IN}$. The gate driver 30 may be integrated in the p-well 22 and supplied with the internal supply voltage $V_{DD}$.

As can be seen from FIG. 2, the pn-junction J1 becomes forward biased when the output voltage $V_{OUT}$ is negative, which can be caused by various effects as discussed above. As a result, the reverse diode $D_R$ of the MOSFET $T_1$ becomes forward biased (and thus conductive) and current flows from the body regions 12 into the surrounding epitaxial layer 11. Similarly, the pn-junction J2 becomes forward biased (and thus conductive) and current flows from the p-well 22 into the epitaxial layer 11. The pn-junction J2 is, however, the base-emitter diode of a parasitic bipolar junction transistor (BJT) $Q_1$, which is formed by the n-doped epitaxial layer 11 (emitter), the p-well 22 (base), and the n-doped supply contact region(s) 23 (collector) embedded in the p-well 22. Therefore, the current through the pn-junction J2 can be seen as base current activating the parasitic BJT $Q_1$. When active, the BJT $Q_1$ has a collector-emitter saturation voltage $V_{CE\text{-}sat}$ of, e.g., about 0.5 volts. Thus, assuming the output voltage $V_{OUT}$ (drain voltage of the MOSFET $T_1$) is approximately −1.5 volts and the supply voltage $V_{DD}$ at the supply terminal SUP is 5.5 volts results in a voltage drop of 6.5 volts across the resistor $R_{ESD}$ which limits the current through the chip to 32.5 milliamperes for $R_{ESD}$=200 Ohms. The internal supply voltage $V_{DDint}$ collapses to −1 volt. As a result, the gate driver may not be able generate a gate signal to switch the power MOSFET $T_1$ on; furthermore all digital information stored in circuits residing in the p-well 22 (e.g., latches, etc.) may be lost. As such, the device including the chip may be inoperative in such a situation of reverse current and negative output voltage. Even a temporary forward biasing of the pn-junctions J1 and J2 may lead to a reset of the circuitry embedded in the p-well 22.

For instance, in some circumstances the pn-junction forming the mentioned pn-junction isolation may become forward biased, which makes the pn-isolation ineffective. As a result, current can pass through the pn-junction between n-substrate and p-well, which may negatively affect the operation of the circuitry implemented in the affected p-well. The mentioned forward biasing of the pn-junction isolations may occur in various situations. For example, the potential of the drain electrode may become negative with respect to the potential of the source electrode when switching inductive loads with low-side n-channel MOSFETs. The negative drain potential entails a negative substrate potential thus forward-biasing the pn-junction isolation between the n-substrate and the p-wells formed therein. A similar problem may occur due to a shift of the ground potential as a result of a voltage drop in the ground line. Moreover, disturbances in the supply lines (e.g., due to electrostatic discharges, ESD) may also lead to a forward biasing of the mentioned pn-junction isolations.

Figure 3:
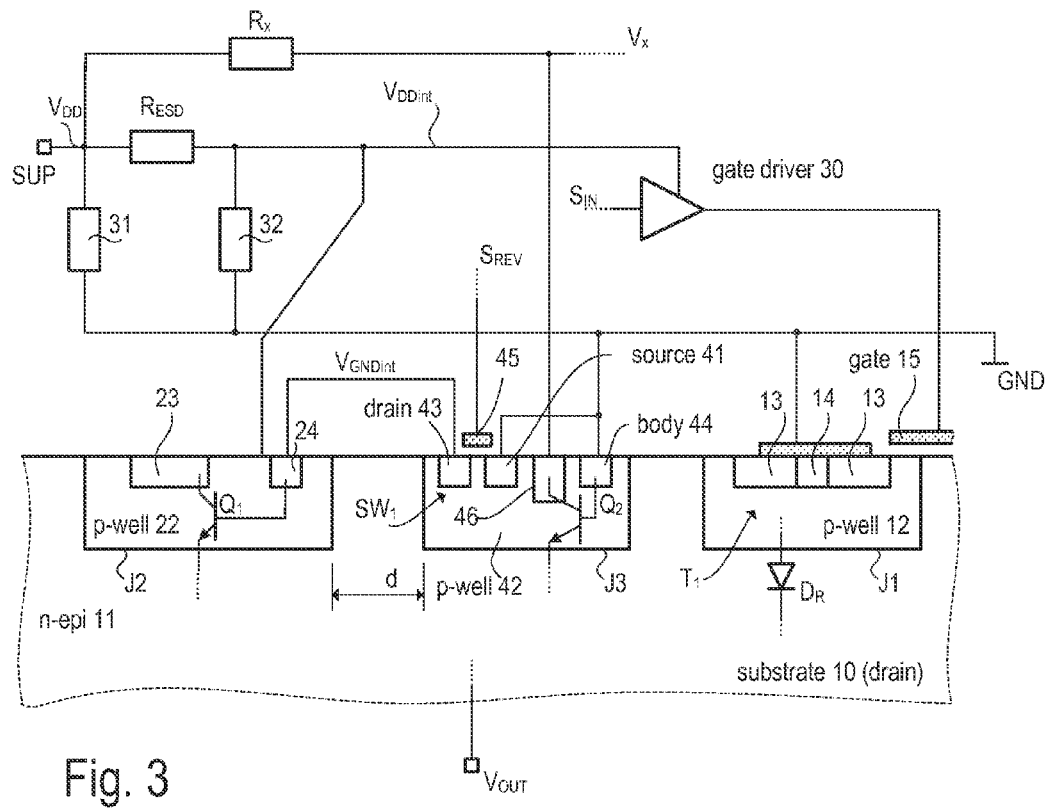
FIG. 3 illustrates a semiconductor device including a vertical power MOS transistor and additional low power circuitry isolated from the substrate by a pn-junction isolation in accordance with one embodiment.

To avoid the problems discussed above, the connection between the p-wells 12 (body regions) and the p-well 22 can be interrupted using a switch $SW_1$. This situation is illustrated in FIG. 3 which is essentially the same as FIG. 2, except that the p-well 22 (see FIG. 2) is laterally spaced apart from the p-wells 12 of the transistor cell array of the power transistor $T_1$, and a further p-well 42 is formed between the p-well 22 and the one or more cells (cell array) of the power transistor $T_1$ (i.e. the one or more p-wells 12). The further p-well 42 includes a lateral n-channel MOS transistor (forming the mentioned switch $SW_1$), which is configured to connect the p-well 22 (in which the low power circuitry and logic circuitry are integrated) with (and disconnect from) the p-wells 12, which form the body regions of the transistor cells of the power transistor $T_1$. The body region of the lateral MOS transistor is formed by the p-well 42, and n-regions 41 and 43 form source and drain of the transistor, respectively. The p-well 42 also includes a heavily doped body contact region 44, which is electrically connected with the source region via a low resistance current path (e.g. metal or polycrystalline silicon) to effectively short-circuit source and body of the MOS transistor. The p-well may further include n-doped regions 46, which are coupled to the external supply terminal SUP via a resistor $R_X$. Similar to the p-well 22, p-well 42 and the surrounding n-doped silicon (epitaxial layer 11 of the substrate 10) form another pn-junction J3. A gate electrode 45 of the MOS transistor (switch $SW_1$) is arranged on the top surface of the semiconductor body and isolated therefrom, e.g. by a gate oxide layer (not shown in FIG. 3). A gate signal $S_{REV}$ is supplied to the gate electrode 45 to switch the MOS transistor on and off in accordance with the gate signal $S_{REV}$. The MOS transistor (switch $SW_1$) is discussed below in more detail.

The drain region 43 of the MOS transistor is electrically connected to the well contact region 24 of the neighboring p-well 22, and the source region 41 of the MOS transistor is electrically connected to the body regions 12 of the power transistor $T_1$ and thus also to the ground terminal GND. As a result, the MOS transistor in p-well 42 (switch $SW_1$) is configured to connect the p-well 22 with or disconnect the p-well 22 from the body regions 12 of the power transistor $T_1$ in accordance with the gate signal $S_{REV}$.

Figure 4:
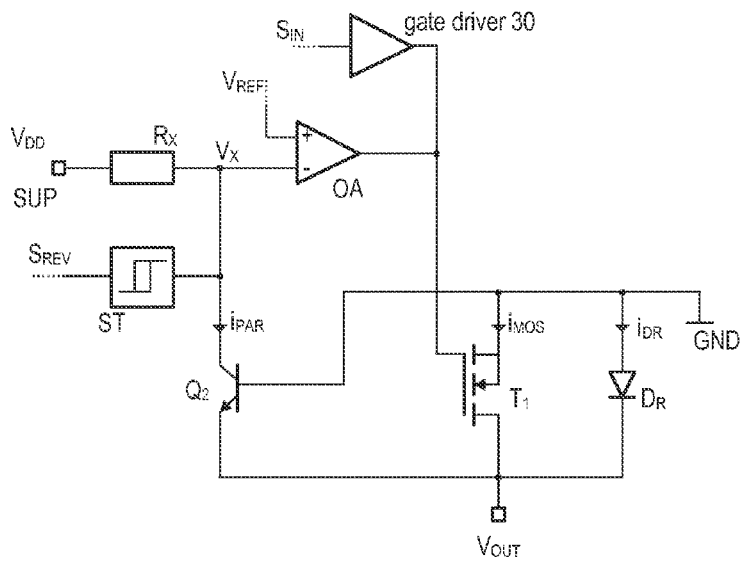
FIG. 4 illustrates a circuit diagram representing the structure of FIG. 3 with additional circuitry for decoupling the p-wells from the cell array of the power transistor.

In some examples, the switch $SW_1$ may be used to disconnect the p-well 22 (in which the low power and logic circuitry resides) from p-doped body regions of the power MOS transistor $T_1$ as soon as a reverse conduction (i.e. a forward biasing of the pn-junction J1, i.e. diode $D_R$) is detected. The p-well 42, the n-doped region 46 included therein, and the resistor $R_X$ are together used as a sensor circuitry to detect the mentioned reverse conduction state of the semiconductor device. Similar to the parasitic bipolar transistor $Q_1$ in p-well 22, a further parasitic bipolar transistor $Q_2$ is formed in p-well 42. The substrate 10 (epitaxial layer 11) forms the n-doped emitter, the p-well 42 forms the p-doped base, and the n-doped region 46 forms the collector of the bipolar transistor $Q_2$. FIG. 4 illustrates a circuit diagram representing the right portion of the device shown in FIG. 3.

FIG. 4 is an equivalent circuit diagram representing a portion of FIG. 3 and illustrates power MOS transistor $T_1$ and reverse diode $D_R$, which is connected parallel to the drain-source current path of the MOS transistor $T_1$. The source terminal of the power MOS transistor $T_1$ is connected to ground terminal GND, and the drain terminal of power MOS transistor $T_1$ is connected to the output terminal $V_{OUT}$. FIG. 4 also illustrates the parasitic bipolar transistor $Q_2$ present in p-well 42. The base-emitter diode of bipolar transistor $Q_2$ (formed by pn-junction J2) is also connected in parallel to the drain-source current path of power MOS transistor $T_1$. The collector (see FIG. 3, n-doped region 46) of bipolar transistor $Q_2$ is connected to the supply terminal SUP via resistor $R_X$. The voltage at the collector of bipolar transistor $Q_2$ is denoted with $V_X$ (see also FIG. 3).

When the drain voltage (i.e. the output voltage $V_{OUT}$) of the power MOS transistor $T_1$ becomes negative, and thus the reverse diode $D_R$ (pn-junction J1) becomes forward biased, the base-emitter diode of parasitic bipolar transistor $Q_2$ will always be forward biased, and the collector voltage $V_X$ will drop (from approximately $V_{DD}$) close to the output voltage $V_{OUT}$. For example, $V_{OUT}$=−1.5 V, $V_X$=−1V. Thus, the mentioned voltage swing at the collector of bipolar transistor $Q_2$ indicates a reverse conduction state of the device. Thus, the bipolar transistor $Q_2$ and the resistor $R_X$ may be regarded as (part of a) detection circuit for detecting reverse biasing of the pn-junctions J1 and J2. To disconnect the p-well 22 from the p-wells 12 the voltage $V_X$ is used to generate the gate signal $S_{REV}$ for opening the switch $SW_1$ (see FIG. 3). For instance, the voltage $V_X$ may be applied to the input of a Schmitt-Trigger ST (comparator with hysteresis) which generates, as output, the gate signal $S_{REV}$. The gate signal $S_{REV}$ will assume a high level to close the switch $SW_1$, when the voltage $V_X$ is close to $V_{DD}$, and the gate signal $S_{REV}$ will assume a low level to open the switch $SW_1$, when the voltage $V_X$ is close to $V_{OUT}$ (which indicates reverse conduction). Due to the hysteresis, toggling of the switch $SW_1$ may be prevented.

Furthermore, the voltage $V_X$ may be applied to the input of a further comparator OA, which is configured to compare the voltage $V_X$ with a reference voltage $V_{REF}$. When the voltage $V_X$ falls below the reference voltage $V_{REF}$, the comparator output will switch to a high level used for activation of the power transistor $T_1$ during reverse conduction in order to reduce losses in the reverse diode $D_R$. The output of the comparator OA overrides the output of the gate driver 30.

Figure 5:
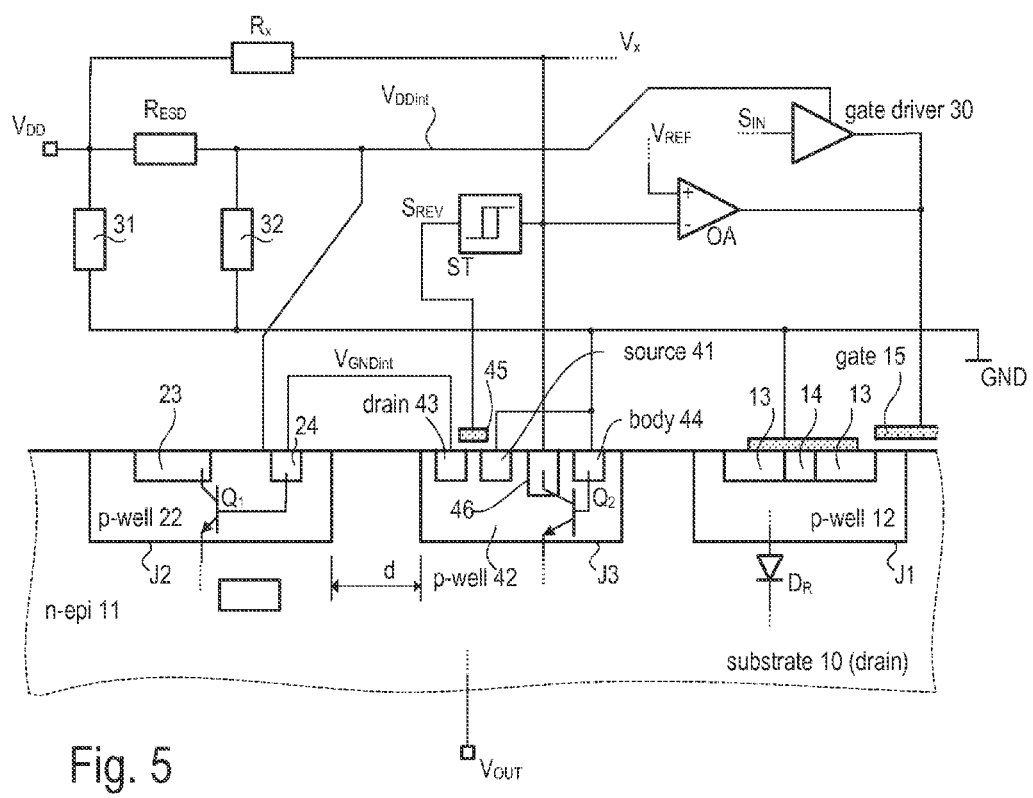
FIG. 5 illustrates the device of FIG. 3 in more detail.

FIG. 5 illustrates essentially the same device as FIG. 3, and additionally the Schmitt trigger sT and the comparator OA shown in FIG. 4

Although the techniques been illustrated and described with respect to one or more implementations, alterations and/or modifications may be made to the illustrated examples without departing from the spirit and scope of the appended claims. In particular regard to the various functions per formed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated example implementations. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:

1. A semiconductor device comprising:
   a semiconductor substrate doped with dopants of a first type;
   a vertical transistor composed of one or more transistor cells, each transistor cell having a body region formed in the substrate and doped with dopants of a second type, the body regions forming first pn-junctions with the surrounding substrate;
   at least a first well region formed in the substrate and doped with dopants of a second type to form a second pn-junction with the substrate, the first well region being electrically connected to the body regions of the vertical transistor via a semiconductor switch;
   a second well region formed in the substrate and doped with dopants of a second type to form a third pn-junction with the substrate;
   and a detection circuit at least partially integrated in the second well region which detects whether the first pn-junctions are reverse biased,
   wherein the semiconductor switch electrically connects or disconnects the first well region(s) and the body regions of the transistor cells based on whether the first pn-junctions are reverse biased or not reverse biased, wherein the switch is driven to be opened when the first pn-junctions are reverse biased, and to be closed when the first pn-junctions are not reverse biased.

2. The semiconductor device of claim 1,
   wherein the semiconductor switch includes a further MOS transistor, which is a lateral transistor that is integrated in the second well region;
   wherein the second well region is electrically coupled to the body regions of the vertical transistor.

3. The semiconductor device of claim 2,
   wherein the second well region is a body region of the further MOS transistor.

4. The semiconductor device of claim 2,
   wherein the detection circuit generates a gate signal to activate or deactivate the further MOS transistor dependent on whether or not the first pn-junctions are not reverse biased.

5. The semiconductor device of claim 1,
   wherein the second well region includes a collector region which is doped with dopants of the first type to form a bipolar transistor; the second well region being the base of the bipolar transistor and the semiconductor substrate being the emitter of the bipolar transistor.

6. The semiconductor device of claim 5, wherein the collector region of the bipolar transistor is coupled to a supply potential via a resistor.

7. The semiconductor device of claim 1,
   wherein the first well region includes at least one of: analog circuitry, digital logic circuitry, a gate driver circuit, communication circuitry, which are isolated from the substrate by a pn-junction isolation provided by the second pn-junction.

8. The semiconductor device of claim 5, wherein the collector region is connected to the input of a trigger circuit that generates a driver signal supplied to the semiconductor switch.

9. The semiconductor device of claim 5, wherein the collector region is connected to the input of a comparator generates an output for activating the transistor cells of the vertical transistor, when the voltage at the collector region drops below a reference voltage.

10. The semiconductor device of claim 1 wherein the first well region(s) and the second well region are spaced apart in a lateral direction thus being separated by the substrate doped with dopants of a first type.

11. The semiconductor device of claim 1, wherein the vertical transistor is composed of a plurality of transistor cells; the body regions of the transistor cells being electrically connected to each other.

12. The semiconductor device of claim 11, wherein the body regions of the transistor cells are coherently linked together.

* * * * *